(12) United States Patent
Martin

(10) Patent No.: US 6,921,897 B1
(45) Date of Patent: Jul. 26, 2005

(54) CIRCUIT AND METHOD FOR VARYING THE INTEGRATION TIME OF MOVING CHARGES FROM A PHOTODETECTOR

(75) Inventor: Robert J. Martin, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 351 days.

(21) Appl. No.: 09/666,301

(22) Filed: Sep. 21, 2000

(51) Int. Cl.[7] ............................................. H01L 29/15
(52) U.S. Cl. ................................. 250/338.1; 250/338.4
(58) Field of Search .......................... 250/338.1, 338.4, 250/339.02, 214 R, 214 AL; 257/431; 327/336, 337, 514

(56) References Cited

U.S. PATENT DOCUMENTS

| | | | |
|---|---|---|---|
| 3,624,501 A | * 11/1971 | Joseph | ........................ 324/111 |
| 3,907,439 A | 9/1975 | Zanoni | |
| 3,934,161 A | 1/1976 | Caywood | |
| 4,394,683 A | 7/1983 | Liptay-Wagner et al. | |
| 4,839,605 A | * 6/1989 | Trett et al. | ................... 328/146 |
| 4,849,814 A | 7/1989 | Van De Steeg | |
| 4,903,101 A | 2/1990 | Maserjian | |
| 4,956,686 A | 9/1990 | Borrello et al. | |
| 4,997,280 A | 3/1991 | Norris | |
| 5,013,918 A | 5/1991 | Choi | |
| 5,047,822 A | 9/1991 | Little, Jr. et al. | |
| 5,155,597 A | 10/1992 | Lareau et al. | |
| 5,198,659 A | 3/1993 | Smith et al. | |
| 5,300,780 A | 4/1994 | Denney et al. | |
| 5,355,000 A | 10/1994 | Delacourt et al. | |
| RE34,802 E | 11/1994 | Sayag | |
| 5,384,469 A | 1/1995 | Choi | |
| 5,488,504 A | 1/1996 | Worchesky et al. | |
| 5,539,206 A | 7/1996 | Schimert | |
| 5,629,522 A | 5/1997 | Martin et al. | |
| 5,692,062 A | 11/1997 | Lareau et al. | |
| 5,762,045 A | 6/1998 | Pockstaller et al. | |
| 5,965,899 A | 10/1999 | Little, Jr. | |
| 6,040,570 A | 3/2000 | Levine et al. | |
| 6,180,935 B1 | 1/2001 | Hoagland | |
| 6,441,848 B1 | 8/2002 | Tull | |

OTHER PUBLICATIONS

James H. Duncan and Tsai–Chia Chou, "On the Detection of Motion and the Computation of Optical Flow", Mar. 1992, IEEE Transactions on Patterns Analysis and Machine Intelligence vol. 14, No. 3, pp. 346–352.

W.A. Beck, et al., "Imaging Performance of 256×256 LWIR Miniband Transport Multiple Quantum Well Focal Plane Arrays", pp. 1–14, Proc. Second Int. Symp. 2–20 $\mu$m Wavelength Infrared Dets. and Arrays: Phys. and Appl., Oct. 10–12, 1994, Miami Beach, Florida.

Lester J. Kozlowski, et al., "LWIR 128 × 128 GaAs/AlGaAs Multiple Quantum Well Hybrid Focal Plane Array", IEEE Translation on Electron Devices, vol. 38, No. 5, May 1991, pp. 1124–1130.

(Continued)

Primary Examiner—Otilia Gabor
(74) Attorney, Agent, or Firm—Burns, Doane, Swecker & Mathis, L.L.P.

(57) ABSTRACT

An infrared photodetector includes at least two quantum well layers with depths adjusted to provide different peak spectral responses. A readout circuit includes first and second charge wells for receiving moving charges from the photodetector. The readout circuit also includes a switching mechanism for selectively switching the second charge well in parallel with the first charge well, to vary the integration time of the moving charges. Switching the second charge well in parallel with the first charge well increases the dynamic range of the system. The switching can be based on one or more of a) a range to a target that is being detected by the photodetector, b) a brightness (e.g. in the infrared range) of the target, c) a rate charge of the first charge well, and d) a remaining capacity of the first charge well.

3 Claims, 2 Drawing Sheets

OTHER PUBLICATIONS

A Köck, et al., "Double Wavelength Selective GaAs/AlGaAs Infrared Detector Device", Applied Physics Letters 60(16), Apr. 20, 1992, pp. 2011–2013.

I. Gravé, et al., "Voltage–Controlled Tunable GaAs/AlGaAs Multistack Quantum Well Infrared Detector", Applied Physics Letters 60 (19), May 11, 1992, pp. 2362–2364.

E. Martinet, et al., Switchable Bicolor (5.5–9.0 $\mu$m) Infrared Detector Using Asymmetric GaAs/AlGaAs Multiquantum Well, Applied Physics Letters 61(3), Jul. 20, 1992, pp. 246–248.

K. Kheng, et al., "Two–Color GaAs/(AlGa)As Quantum Infrared Detector With Voltage–Tunable Spectral Sensitivity At 3–5 and 8–12 $\mu$m", Applied Physics Letters 61(6), Aug. 10, 1992, pp. 666–668.

K.L. Tsai, et al., "Two–Color Infrared Photodetector Using GaAs/AlGaAs and Strained InGaAs/AlGaAs Multiquantum Wells", Applied Physics Letters 62 (26, Jun. 28, 1993, pp. 3504–3506.

B.F.Levine, "Quantum–Well Infrared Photodetectors", Journal of Applied Physics 74 (8), Oct. 15, 1993, pp. 1–87.

C.G. Bethea, et al., "Long Wavelength Infrared 128 × 128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AlAs/AlGaAs and GaAs/AlGaAs Stacked Quantum Well Infrared Photodetector For 3–5 and 8–14 $\mu$m Detection", Journal of Applied Physics 76(4), Aug. 15, 1994, pp. 2538–2540.

M.Z. Tidrow, et al., "Grating Coupled Multicolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letters 68(11), Mar. 11, 1996, pp. 1446–1448.

T.R. Schimert, et al., "Enhanced Quantum Well Infrared Photodetor With Novel Multiple Quantum Well Grating Structure", Applied Physics Letters 68 (20), May 13, 1996, pp. 2846–2848.

* cited by examiner

CIRCUIT AND METHOD FOR VARYING THE INTEGRATION TIME OF MOVING CHARGES FROM A PHOTODETECTOR

The present application is related to application Ser. No. 09/666,847, entitled "Three Color Quantum Well Focal Plane Arrays", application Ser. No. 09/666,828, entitled "Programmable Hyper-Spectral Infrared Focal Plane Array," application Ser. No. 09/666,297, entitled "Remote Temperature Sensing Long Wavelength Modulated Focal Plane Array, application Ser. No. 09/665,959, entitled "Clutter Discriminating Focal Plane Array," and application Ser. No. 09/666,296, entitled "Large Dynamic Range Focal Plane Array," all filed on even data herewith. The disclosures of the above identified Patent Applications are herein incorporated by reference.

BACKGROUND OF THE INVENTION

1. Field of the Invention

The present invention is directed generally to quantum well infrared photodetector focal plane arrays (QWIP FPA's) and, more particularly, to QWIP FPAs that are capable of multicolor detection.

2. Background Information

Multicolor infrared detection capability has wide applicability to a number of different applications including aerospace, medical, surveying, mining, and agriculture. For example, multicolor infrared detection can provide useful information during geographical surveys. Detection in at least two infrared (IR) spectal bands could permit differentiation between man-made structures and natural landscape in a geographical survey. Additionally, in medical applications, multi-color detection would permit improved thermal imaging of the human body for diagnostic purposes.

Multicolor infrared detection has been conventionally performed using a wide-band IR detector and an associated rotating mechanical multicolor filter wheel. The wide-band IR detector detects a broad range of incident wavelengths. The rotating filter wheel selects the desired wavelength that is to be passed to the wide-band detector. An exemplary mechanical color filter wheel system is disclosed in U.S. Pat. No. 5,300,780. Mechanical color wheel systems, however, suffer from a number of deficiencies in multicolor detection. Such systems generally are slow and bulky, require large amounts of power for operation, and have a limited life span. Additionally, color wheel systems tend to have poor photon collection efficiency.

To alleviate some of the known deficiencies of mechanical color filter wheel systems, quantum well photodetectors have been constructed that permit the detection of more than one spectral band. Such detectors are described, for example, in U.S. Pat. Nos. 5,013,918, 5,198,659, and 5,384,469. These patents generally disclose the use of a plurality of quantum well sets within a single detector where the frequency response characteristics of each quantum well in the set is tailored by adjusting the well depths. The detectors in these patents are designed for use with a single bias voltage that is applied across all the quantum wells of the set. Thus, each quantum well that is "tuned" to a specific frequency band can not have its bias adjusted independent of any other "tuned" quantum well in the set. The output voltage responses for each of the "colors" in the detector will therefore be nonuniform for any given background photon flux. In addition, the detectors of these patents provide only a single detected output signal composed of multi-spectral frequency components. Extraction of different frequency bands from the single output therefore requires additional filtering.

Accordingly, there exists a need in the art for a quantum well photodetector that has multi-color capability but which can also provide independent bias adjustment for each color and which can independently and simultaneously process the outputs of each of the colors of the detector.

SUMMARY OF THE INVENTION

Exemplary embodiments of the present invention use a vertically stacked quantum well infrared detector where each "tuned" quantum well of the detector can be biased separately from any other quantum well of the detector. The vertically stacked detector can include two quantum well layers that are "tuned" to different peak wavelengths to permit detection of infrared radiation of two different bands or colors. Simultaneous detection in two spectral bands permits the determination of more information about an infrared source.

The present invention is directed to a photodetector comprising: a first quantum well layer; a second quantum well layer, wherein said first quantum well layer is formed atop said second quantum well layer; and means for independently biasing said first and second quantum well layers. The present invention is additionally directed to a method of fabricating such a photodetector.

The present invention is also directed to a photodetector comprising: first means responsive to impinging energy of a first spectral band; and second means responsive to impinging energy of a second spectral band, wherein said impinging energy of said second spectral band first passes through said first means before reaching said second means, and further wherein said first means provides a first quantity of moving charges to a first output of said photodetector and said second means provides a second quantity of moving charges to a second output of said photodetector.

Exemplary embodiments of the present invention are also directed to a circuit for varying the integration time of moving charges from a photodetector comprising: a first charge well for receiving moving charges from a photodetector; at least one additional charge well; and means for selectively switching said at least one additional charge well in parallel with said first charge well to vary the integration time of said moving charges.

The present invention is further directed to a method of varying the integration time of moving charges from a photodetector comprising the steps of: supplying moving charges from a photodetector to an integration capacitance; and selectively varying said integration capacitance to vary the integration time of said moving charges.

BRIEF DESCRIPTION OF THE DRAWINGS

Other objects and advantages of the invention will be apparent to those skilled in the art reading the following detailed description of the preferred embodiments in conjunction with the drawings in which like reference numbers have been used to indicate like elements and wherein.

DETAILED DESCRIPTION OF THE PREFERRED EMBODIMENTS

Multicolor detection in exemplary embodiments of the invention is achieved by adjusting depths of the one or more quantum wells associated with each spectral band of a detector. Based on well known physical principles, the vertical depth of the one or more quantum wells comprising a photosensitive layer of a detector determines the energy required from impinging photons to permit carriers in the well to escape for conduction. The vertical depth of each quantum well thus determines the spectral response of the photosensitive layer to radiation in the form of impinging photons of various wavelengths. The allowed energy states in a quantum well are:

$$E_n = \frac{h^2 n^2}{8ml^2} \text{ joules} \qquad \text{Eqn. (1)}$$

where h is Planck's constant=$6.626*10^{-34}$ joule*seconds m is the effective mass of the carrier n is an integer n=1, 2, 3 . . .

$E_n$ is the energy of a given band in Joules l is the depth of the quantum well in meters.

For a carrier to move between the valence band (n=1) and the conduction band (n=2), the following energy $E_{1,2}$ is required to free the carrier from the valence band:

$$E_{1,2} = E_g = \frac{h^2(2^2 - 1^2)}{8ml^2} = \frac{3h^2}{8ml^2} \text{ joules} \qquad \text{Eqn. (2)}$$

The energy required to free the carrier from the valence band to the conduction band ($E_{1,2}$) is alternatively called the energy gap, $E_g$. The energy given up by an impinging photon must be equal to or larger than the energy gap ($E_g$). Photon energy ($E_p$) is related to the wavelength of the photon by the following:

$$E_p = \frac{hc}{\lambda_p} \text{ joules} \qquad \text{Eqn. (3)}$$

where h is Planck's constant=$6.626*10^{-34}$ Joule*seconds c is the velocity of light=$3*10^8$ meters/second (in a vacuum)

$\lambda_p$ is the peak wavelength corresponding to the middle of the band in meters.

By setting the photon energy ($E_p$) equal to the energy gap ($E_g$) between the bands, the relationship of the well depth to the peak wavelength needed to free carriers is demonstrated:

$$\lambda_p = \frac{8mcl^2}{3h} \text{ meters} \qquad \text{Eqn. (4)}$$

Equation 4 is based on a general model, and those skilled in the art will recognize that other factors can influence the proportionality constant between wavelength and well depth. However, the peak wavelength can generally be considered proportional to the well depth:

$$\lambda_p = a_o l^2 \text{ meters} \qquad \text{Eqn. (5)}$$

where $a_o$ is a proportionality constant

Thus, as is apparent from Equation 5, the spectral response of a quantum well layer can be "tuned" to the desired peak wavelength by adjusting the depths of the one or more wells comprising the layer.

Figure 1:
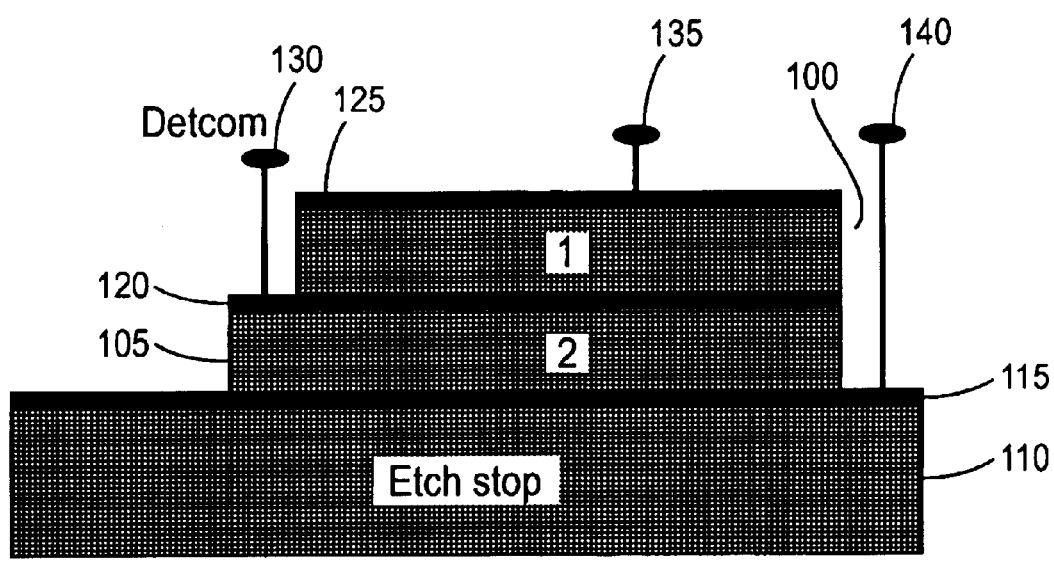
FIG. 1 is a structural diagram of a two color quantum well detector in accordance with an exemplary embodiment of the present invention.

FIG. 1 illustrates an exemplary embodiment of a dual color detector in accordance with the invention where two vertically stacked quantum wells have been "tuned" to different spectral bands or "colors" by adjustment of the depths of the quantum wells comprising each photosensitive layer of the detector. This dual color detector is formed using a first means responsive to impinging energy, or radiation, of a first spectral band, represented in the FIG. 1 embodiment as quantum well layer 100. Quantum well layer 100, comprising one or more quantum wells of a first depth, is layered over a second means responsive to impinging energy, or radiation, of a second spectral band, represented in the FIG. 1 embodiment as second quantum well layer 105. Second quantum well layer 105 further comprises one or more quantum wells of a second depth. The first means is formed adjacent the second means such that impinging energy in the second spectral band first passes through the first means before reaching the second means.

Using known molecular beam epitaxy (MBE) techniques, the layers of the detector can be fabricated using the following exemplary process. First, an etch stop layer 110 is formed using a material such as AlGaAs, for example, and then a first contact layer 115, doped to a first conductivity, is formed upon a surface of the etch stop layer 110. Next, a first quantum well layer 105 comprising one or more quantum wells of a depth corresponding to a first desired peak wavelength is formed over the first doped contact layer 115. A second contact layer 120, doped to a second conductivity, is next formed over the first quantum well layer 105. A second quantum well layer 100, comprising one or more quantum wells of a depth corresponding to a second desired peak wavelength, is then formed over the second doped contact layer 120, followed by a third contact layer 125, doped to a third conductivity. The formation of each layer of the detector can be performed using any conventional techniques appropriate for the layer being established including, but not limited to, growth or deposition techniques.

Quantum well layers 100 and 105 can include multiple sublayers composed of alternating barrier sublayers and quantum well sublayers such as, for example, 20-period GaAs/Al$_x$Ga$_{1-x}$As multi-quantum well stacks with the GaAs well depths and Al compositions adjusted to yield the desired peaks and spectral widths. One skilled in the art will recognize, however, that other multi-quantum well stacks can be used such as, for example, those disclosed in U.S. Pat. No. 5,539,206 to Schimert, the disclosure of which is incorporated by reference herein. Furthermore, first contact layer 115, and contact layers 120 and 125 can be composed of doped GaAs (e.g., n+ GaAs), for example, though one skilled in the art will recognize that other suitable contact layer materials can be used. One skilled in the art will further recognize that various doping concentrations for the quantum wells and contact layers can be used in the present invention such as, for example, the doping concentrations disclosed in the above-identified U.S. Patent to Schimert.

Referring to FIG. 1, the electrical connection for interfacing between the detector structure and the read out integrated circuit (ROIC) (not shown) of one exemplary embodiment can be seen. As illustrated in the Figure, an electrical contact 130 is connected to the second contact layer 120 for connection to the common bias voltage (DETCOM) of the Read Out Integrated Circuit (ROIC). Electrical contacts 135 and 140 are further connected to contact layers 125 and 120, respectively, for connection to individual detector bias voltages supplied by the ROIC. The difference between the common bias voltage and the individual bias voltages supplied by the ROIC to each of the electrical contacts 135 and 140 establishes different bias voltages across each of the quantum well layers 100 and 105 of the detector. Electrical contacts 135 and 140, each being associated with a different one of the quantum well layers 100 and 105, thus provide means for biasing each band independently in conjunction with the individual detector bias voltages supplied by the ROIC. During operation, electrical contacts 135 and 140 additionally constitute outputs of the detector which supply photocurrent from each quantum well to the ROIC circuitry associated with each vertically stacked detector. Electrical contacts 130, 135, and 140 can be, for example, composed of Indium "bumps," or as any conventional contact known to those skilled in the art.

In an alternate exemplary embodiment, the two quantum well layers 100 and 105 are grown to produce long-wave spectral responses. The one or more quantum wells of first quantum well layer 105 are each grown to a specified depth to produce a desired peak spectral response (for example, a response at 8.6 $\mu$m) and the one or more quantum wells of the second quantum well layer 100 are each grown to produce a different peak spectral response (for example, a response at 11.2 $\mu$m). Each quantum well layer can be composed of, for example, a 20-period GaAs/Al$_x$Ga$_{1-x}$As multi-quantum well stack with the GaAs well depths and the Al compositions adjusted to yield the desired peak and spectral width. The barriers of the quantum wells comprise compositions of predetermined thicknesses to provide sufficient isolation of each quantum well from adjacent quantum wells (for example, ~550–600 Å thick undoped AlGaAs). The GaAs wells are further doped with Si, for example, to provide ground state electrons. The first quantum well layer 105 is stacked on top of the second quantum well layer 100, with an ohmic contact layer 120 of doped material (for example, doped GaAs) separating the two. An ohmic contact layer 115 of doped Gas below the second quantum well layer 105 and another doped GaAs ohmic contact layer above the first quantum well layer 100 complete the detector structure. An etch stop layer 110, comprising, for example, two AlGaAs etch stop layers (not shown) separated by an isolation layer of undoped GaAs (not shown), is formed beneath the dual quantum well structure.

The GaAs/AlGaAs materials described above permit the realization of quantum wells with peak wavelengths longer than approximately 6.5 $\mu$m. Other exemplary embodiments may use different material systems to provide shorter or longer peak wavelengths. For example, using strained InGaAs in the quantum wells allows peak wavelengths as short as approximately 4.5 $\mu$m. Wavelengths shorter than approximately 4 $\mu$m can further be achieved using the lattice-matched InGaAs/InAlAs/InP material system.

Figure 2:
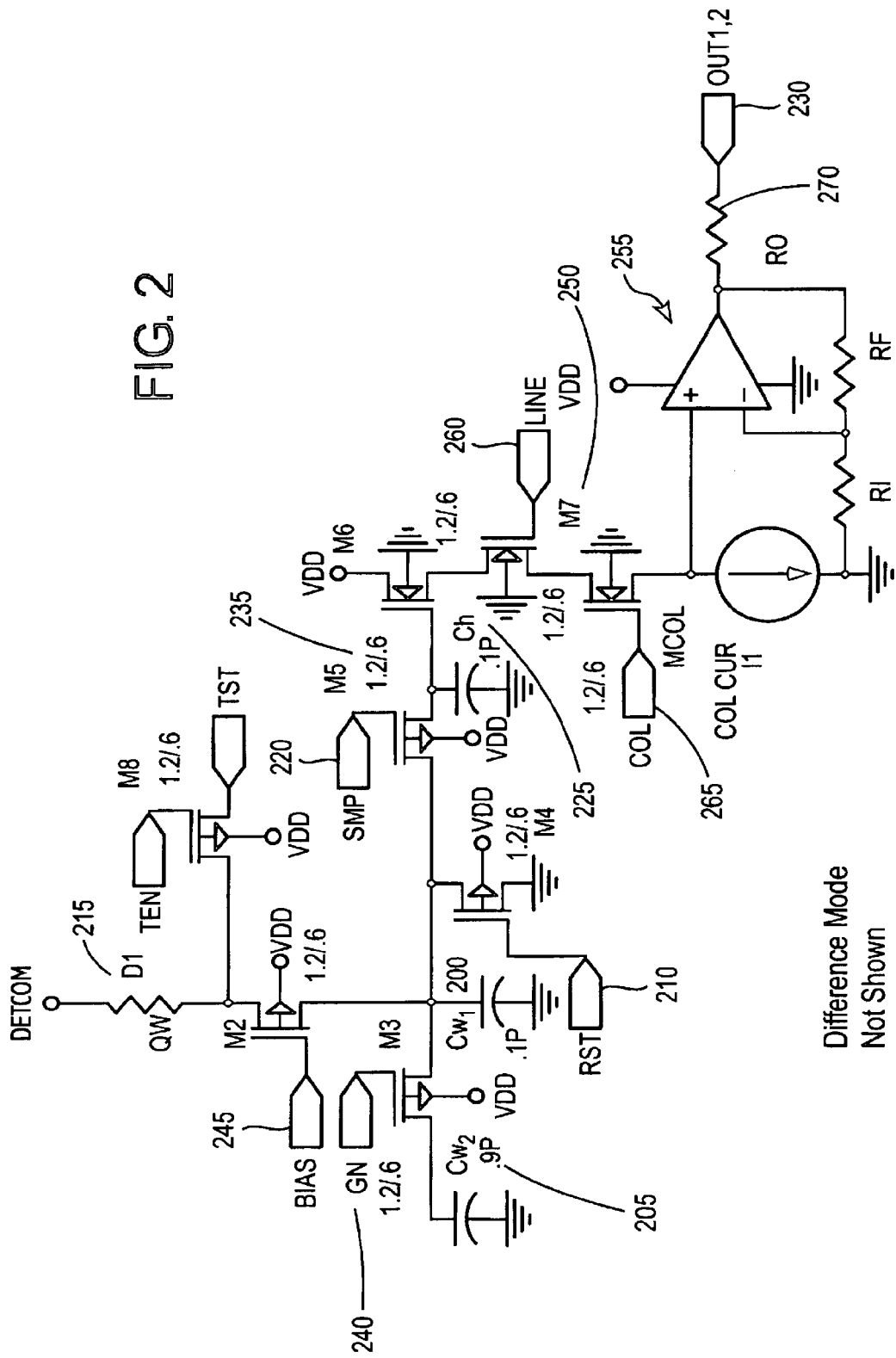
FIG. 2 is a schematic of the readout circuit in accordance with an exemplary embodiment of the invention.

A read out circuit of an exemplary embodiment of the invention is illustrated in FIG. 2. This circuit performs a number of advantageous functions in the photon detection and read out process. One function performed is integration of the detector output for the duration of the next image frame while the current image frame is being "read" at the output of the read out circuit. Every collected signal photon in the detector is precious when an infrared source is at a great distance, and thus, by integrating over the full frame time, the maximum number of electrons is collected. Referring to FIG. 2, integration of the quantum well output for the each image frame is performed by charge well capacitances $C_{w1}$ 200, $C_{w2}$ 205, and reset voltage RST 210. Application and removal of RST voltage 210 permits the charge well capacitances to charge and discharge the electrons from the quantum well 215, thus integrating the quantum well output. The integrated output of the quantum well is then selectively applied to the subsequent sample and hold circuitry by sample switching voltage SMP 220. Storage capacitor $C_h$ 225 stores the integrated output of the quantum well so as to provide the read out for the current image frame at Out$_{1,2}$ 230. The dump, ramp, and sample process performed by the Reset voltage RST 210, the charge wells $C_{w1}$ 200 and $C_{w2}$ 205, the quantum well detector resistance 215, and the storage capacitance $C_h$ 225 emulates an ideal noise filter if the charge well and storage capacitor sizes are properly selected. A signal to noise improvement equal to the square root of three is available with this technique.

The integration process discussed above also performs a second advantageous function—a "non-destructive" read. A "non-destructive" read occurs because the electron charge stored in the storage capacitor $C_h$ 225 is not removed until electrically connected in parallel with the charge well $C_{w1}$ 200 and $C_{w2}$ 205. When the sample SMP voltage 220 is applied at the gate of M5 235, the electrical connection between the charge well and the storage capacitor is made and "charge sharing" occurs. This "charge sharing" produces a very mild image smoothing effect.

A third advantageous function performed by the exemplary read out circuit of FIG. 2 is the improvement of the gain and dynamic range of the read out circuit through the use of two charge wells. At long ranges with faint targets, the number of volts per electron becomes a significant factor and signal to noise ratios thus become critical. As a hot target gets closer, the need changes from the need for maximizing the noise to avoiding saturation due to the very large number of target electrons rapidly filling the charge well. The exemplary read out circuit of FIG. 2 solves this problem by augmenting the integration time through a change in the charge well capacitance. This is done via the two charge well capacitances $C_{w1}$ 200 and $C_{w2}$ 205. Application of a gain switching voltage GN 240 switches in the smaller charge well capacitance $C_{w2}$ 205 to add another twenty decibels of dynamic range to the system's performance. A high total dynamic range performance of 128 decibels can thus be realized (68 dB small well, 40 dB integration time modulation, and 20 dB well change).

A fourth advantageous function of the read out circuit is the balancing of the output voltage response for each of the colors through the use of independent bias adjustment. Balance is achieved by allowing independent bias adjustment for each color, thus permitting a uniform output voltage response for each of the colors for any given background photon flux. This adjustment is shown in FIG. 2, as the BIAS input 245.

An additional advantageous function of the read out circuit is the removal of distortions in low level signals, due to current flowing in the ground reference, by the use of full difference mode outputs. Most power supply noise, ground noise, and induced pickup occurs as common mode noise. The use of difference amplifiers allows these signals to be removed by subtraction. Difference amplifiers are well known in the art and thus have been omitted from the circuitry depicted in FIG. 2.

Another advantageous function of the read out circuit is the elimination of electronic cross coupling. Electronic cross coupling can be avoided by having each color of the detector use its own time division multiplexer and output port. Since most electronic cross talk in time division multiplexers is capacitive, use of very low driving point impedance in the line and column process is important in holding down the temporal-spectral cross talk. This is particularly imperative in high speed applications with wide dynamic range requirements. These characteristics can be achieved through the use of the dual FET M7 250 and push/pull operational amplifier 255. The dual FETs 250 open or close based on time division multiplexing voltages LINE 260 or COLUMN 265. The LINE 260 voltage is used to access a line of cells in the focal plane array and the COLUMN 265 voltage accesses a column of cells in the focal plane array. The push/pull operational amplifier 255 additionally sets the voltage gain of the output circuit to the following relationship:

$$\frac{V_o}{V_i} = \frac{R_F}{R_I\left(1 + \frac{R_F}{R_I}\right)} \qquad \text{Eqn. (6)}$$

The driving point impedance is further set by the resistor $R_o$ 270.

In an additional exemplary embodiment of the invention, higher density focal plane arrays may be produced by removing the charge wells from the ROIC and fabricating the charge wells within the detector structure itself. The smaller pitch required of higher density arrays limits the usable area available for the charge wells in the ROIC underlying the detector structure. By fabricating the charge wells integrally to the detector itself, less space is required in the underlying ROIC and therefore higher densities can be achieved in the array. The technique of using integral charge wells is disclosed in U.S. patent application Ser. No. 09/149,483, entitled "Integral Charge Well for QWIP FPA's," the disclosure of which is herein incorporated by reference.

Optical coupling, in accordance with exemplary embodiments of the invention, can be achieved using a number of different techniques. Principles of quantum selection require that incident electromagnetic fields propagate in the horizontal plane of the quantum well. The incident flux must therefore be reflected inside the quantum well at an angle such that the flux passes through the material many times. In one exemplary embodiment, a rotated waffle diffraction grating is used, where the width of the waffle corresponds to one wavelength, the length of the waffle to another, and the diagonal to a third wavelength. The waffle grating, combined with a top side grating and side wall reflecting mirrors, constitute the optimum "photon in a box" quantum well detector optical system. Additionally, the waffle grating can be enhanced with a flux entry side anti-reflective coating composed of, for example, a quarter wavelength dielectric material. In addition to the waffle grating, one skilled in the art will recognize that a number of different techniques can be used for achieving optical coupling in the present invention. Such techniques include use of random gratings, reflectors, resonance structures, and so forth.

One skilled in the art will recognize that multiple stacks of the two-color detector of the present invention can be used in a focal plane array for multi-color detection. Multi-color detection can be achieved by formation of multiple stacks of two layer quantum wells on a common substrate, with the depths of each well "tuned" to the appropriate peak wavelength. For example, a threesome of two layer detector structures can be used to detect six different spectral bands by "tuning" each of the quantum well layers in the three different vertically stacked structures to different peak wavelengths. Thus, in such an embodiment, three two layer detector structures can be used in tandem to simultaneously detect six different spectral bands.

As one skilled in the art will recognize, a plurality of the vertically stacked detector structures described in the exemplary embodiments above can be formed across an etch stop layer to provide a detector structure array. This array will serve as a focal plane for optics of an IR imaging system. Such optics are conventionally known in the art and are not described here.

One skilled in the art will additionally recognize that the detector and ROIC can be fabricated as integral structures in the focal plane array. Using this fabrication technique, the detector and read out circuitry can be fabricated as a unitary structure, thus removing the need for aligning the detector array structure and the ROIC array structure so as to connect each ROIC, via conductive bumps, with its associated detector across the array.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A circuit for varying the integration time of moving charges from a photodetector comprising:

a first charge well for receiving moving charges from a photodetector;

at least one additional charge well; and means for selectively switching the at least one additional charge well in parallel with the first charge well to vary the integration time of the moving charges, based on a rate at which the moving charges fill the first charge well.

2. The circuit of claim 1, wherein each charge well comprises a capacitor.

3. A method of varying the integration time of moving charges from a photodetector comprising the steps of:

supplying moving charges from a photodetector to an integration capacitance; and selectively varying said integration capacitance to vary the integration time of said moving charges, based on a rate at which the moving charges fill the first charge well.

* * * * *